Figure 1:
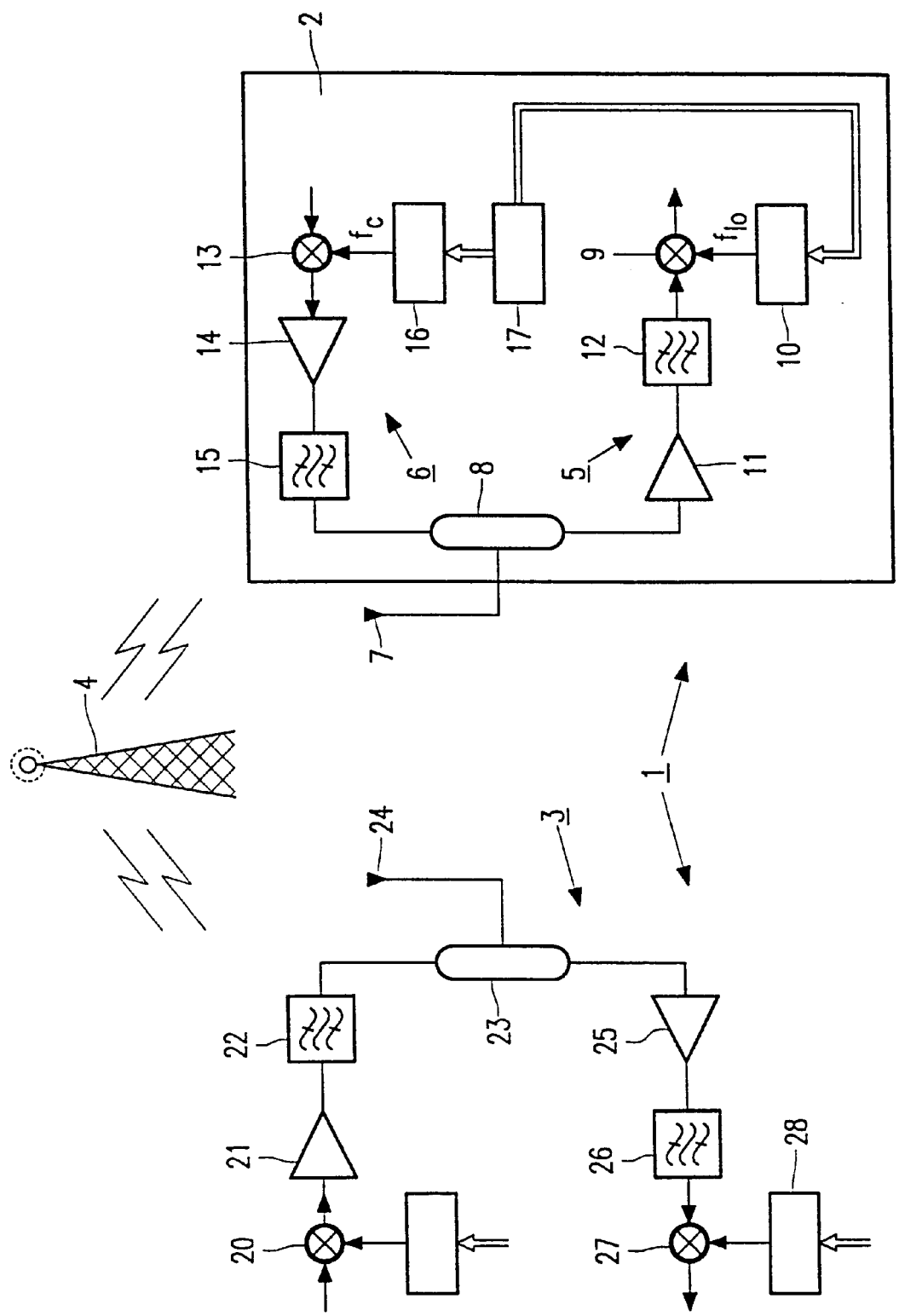

United States Patent [19]
Wang

[11] Patent Number: 6,094,569
[45] Date of Patent: Jul. 25, 2000

[54] MULTICHANNEL RADIO DEVICE, A RADIO COMMUNICATION SYSTEM, AND A FRACTIONAL DIVISION FREQUENCY SYNTHESIZER

[75] Inventor: Zhenhua Wang, Zurich, Switzerland

[73] Assignee: U.S. Philips Corporation, New York, N.Y.

[21] Appl. No.: 09/132,398

[22] Filed: Aug. 11, 1998

[30] Foreign Application Priority Data

Aug. 12, 1997 [EP] European Pat. Off. ............. 97204191

[51] Int. Cl.[7] ...................................................... H04Q 7/20
[52] U.S. Cl. ........................... 455/313; 455/260; 455/265; 455/264; 455/76; 331/2; 331/11; 375/376
[58] Field of Search ..................... 455/260, 262, 455/264, 265, 76, 86, 313, 314; 375/376; 327/147, 156; 331/11, 2

[56] References Cited

U.S. PATENT DOCUMENTS

| | | | |
|---|---|---|---|
| 4,097,816 | 6/1978 | Imazeki et al. ............................. | 331/2 |
| 4,114,110 | 9/1978 | Nossen ....................................... | 331/2 |
| 4,399,560 | 8/1983 | Watkinson ............................... | 455/260 |
| 5,065,408 | 11/1991 | Gillig ....................................... | 375/222 |
| 5,497,126 | 3/1996 | Kosiec et al. ............................ | 331/1 A |
| 5,508,659 | 4/1996 | Brunet et al. .............................. | 331/16 |
| 5,789,987 | 8/1983 | Mittel et al. .............................. | 375/376 |
| 5,847,615 | 12/1998 | Roth ......................................... | 331/16 |
| 5,856,766 | 1/1999 | Gillig et al. ............................... | 331/2 |

OTHER PUBLICATIONS

By P. Horowitz et al., "The Art of Electronics", Cambridge University Press 1980, p. 432.
By U.L. Rohde, "Digital PLL Frequency Synthesizers", Prentice–Hall, 1983 pp. 124–141.
"SA8025 Fractional–N Synthesizer for 2GHZ Band Applications" Philips Semiconductors Sep. 18, 1994. pp. 7–76–7–89.
By T. A. D. Riley et al, "Delta–Sigma Modulation in Fractional–N Frequency Synthesis", IEEE Journal of Solid State Circuits, vol. 28, No.5, pp. 553–559.
By Roland E. Best "Phase Locked Loops", McGraw–Hill 1993, pp. 139, 143–145.

*Primary Examiner*—Daniel S. Hunter
*Assistant Examiner*—Yemane Woldetatios

[57] ABSTRACT

A new architecture for such a type of synthesizer is proposed not having the drawbacks of such known synthesizers and having the same phase noise properties as ordinary integer divide by N synthesizers. The novel architecture has a main PLL with a first integer frequency divider in its feedback loop and further an auxiliary PLL having a second integer frequency divider in its feedback loop.

6 Claims, 2 Drawing Sheets

MULTICHANNEL RADIO DEVICE, A RADIO COMMUNICATION SYSTEM, AND A FRACTIONAL DIVISION FREQUENCY SYNTHESIZER

The present invention relates to a multichannel radio device. Such a multichannel radio device can be a radio communication device such as a cellular or a cordless telephone, a pager, or any other suitable multichannel radio device.

The present invention further relates to a radio communication system and a fractional division frequency synthesizer.

RF (Radio Frequency) frequency synthesizers are used in multichannel radio devices used in radio communication systems, for instance. In such systems, multichannel receivers or transceivers, including rf frequency synthesizers, are used which can tune to a multiple of frequency channels. Such a tuning should be fast because the radio device should be able to switch quickly from one radio channel to another. Furthermore, the radio devices should cause as little adjacent channel interference as possible. For these reasons, high demands should be posed upon the frequency synthesizer used in such radio device as to spectrum purity of its output signal and as to its settling time. Frequency synthesizers are known having a structure of a frequency multiplier such as described in the handbook "The Art of Electronics", P. Horowitz et al., Cambridge University Press, page 432, 1980. In such a synthesizer, an output signal from a VCO (Voltage Controlled Oscillator) is a multiple of a stable reference frequency generated by a crystal oscillator, for instance. A integer division ratio divider divides the output signal and an output of the divider is fed back to a phase detector to which also the reference signal is fed. A loop filter filters the output of the phase detector and the low pass filtered signal controls the VCO. Such a loop is basically a PLL with an integer divider in the feedback path. In communication devices, the reference frequency is chosen equal to the channel spacing. Because of the usually small band width of the loop filter, however, the settling time of such a synthesizer is relatively long so that the synthesizer is slow. To overcome this problem, fractional division frequency synthesizers have been proposed. In the handbook "Digital PLL Frequency Synthesizers", U.L. Rohde, pp. 124–141, Prentice-Hall, 1983, such a fractional N synthesizer, N being a fractional, is described. Because then a higher reference frequency can be used thus in principle a better performance can be achieved than with an ordinary integer division frequency synthesizer, such a fractional N frequency synthesizer still has considerable drawbacks. In order to achieve fractional division, a pulse remover removes pulses fed back from the VCO to the frequency divider at regular intervals when the output of the phase detector has reached a given value. The result is that division by N is alternated with division by N+1. Such an alternate division causes undesired sidebands in the output signal of the synthesizer. At the cost of a highly complicated structure, whereby with the help of a digital-to-analog convertor coupled to an accumulator, a signal is generated which is subtracted from the output signal of the phase detector it is tried to cancel the undesired sidebands. For a more detailed description of such a fractional-N frequency synthesizer referred is to the Application note AN1891, "SA8025 Fractional-N synthesizer for 2 GHz band applications", Philips Semiconductors Sep. 18, 1994. In the article "Delta-Sigma Modulation in Fractional-N Frequency Synthesis", T.A.D. Riley et al., IEEE Journal of Solid State Circuits, Vol. 28, No. 5, pp. 553–559, in which a Sigma-Delta modulator is used to noise-shape the phase jitter in a fractional-N frequency synthesizer. Such a structure is complicated. Both fractional-N frequency synthesizers still have drawbacks. The undesired phase noise is still considerably higher than with ordinary integer division frequency synthesizers. Furthermore, usually external adjustments are needed so as to compensate for residual effects. Because high-speed circuits are required in both types of fractional-N synthesizers, power consumption is considerable, notably in the digital circuits such as the digital-to-analog converter and the Sigma-Delta modulator. Such a relatively high power consumption is particularly undesired in portable phones where it is desired to have as long as possible standby and call times before the battery is exhausted. High complexity also leads to a larger chip area which is undesired from a cost point of view and the desire to have a high degree of integration.

It is an object of the present invention to provide a radio communication device including a fractional division frequency synthesizer having a high performance without the drawbacks of the known fractional-N frequency synthesizer while having a simple structure.

To this end there is provided a fractional division frequency synthesizer, particularly when included in a multichannel radio device, which synthesizer has an output signal at an output of the synthesizer having a frequency being a fractional multiple of a reference frequency generated by a reference frequency generator, which synthesizer comprises a forward path between the reference and said output including a cascade of a first phase detector, a first loop filter and a first voltage controlled oscillator, whereby a first input of the first phase detector is coupled to the reference, which synthesizer further comprises a feedback path between said output and a second input of the first phase detector including a cascade of a first frequency divider, a second phase detector, a second loop filter and a second voltage controlled oscillator, whereby an output of second voltage controlled oscillator is coupled to the second input of the first phase detector and an output of the first frequency divider is coupled to a first input of the second phase detector, and which synthesizer comprises a second frequency divider of which an input is coupled to the second input of the first phase detector and an output is coupled to a second input of the second phase detector, whereby division ratios of the first and second frequency dividers are integers. The present invention is based upon the insight that despite applying an extremely simple structure still solely integer dividers could be used to obtain a fractional-N synthesizer. Such a surprisingly totally different concept of a fractional-N frequency synthesizer has the advantage that the phase noise is as low as the phase noise of an ordinary integer divide by N synthesizer. Furthermore, because the auxiliary PLL is exactly dividing by M/N, M being the integer divisor of the first frequency divider and N being the integer divisor of the second frequency divider, no undesired spurious frequencies are generated. In addition thereto, because the phase noise of the second voltage controlled oscillator is rejected by the first loop filter of the main PLL, the second voltage controlled oscillator can easily be integrated on an IC (Integrated Circuit). Because of the extremely simple structure, low power consumption is obtained, and further a small chip area and a low cost design and development. When using BiCMOS or short-channel CMOS technologies, the complete synthesizer can be easily be integrated on an integrated circuit.

In claims 2–4, various embodiments of the fractional division frequency synthesizer in the multichannel radio device are claimed. In claim 2 it is claimed that the dividers are prescalers. Such prescalers are preferably s-called dual-modulus prescalers, well-known in the art, having two programmable parameters. In claim 3 such an adjustability is claimed. Herewith, any output frequency can be synthesized which is a fractional multiple of the input reference frequency.

Figure 2:
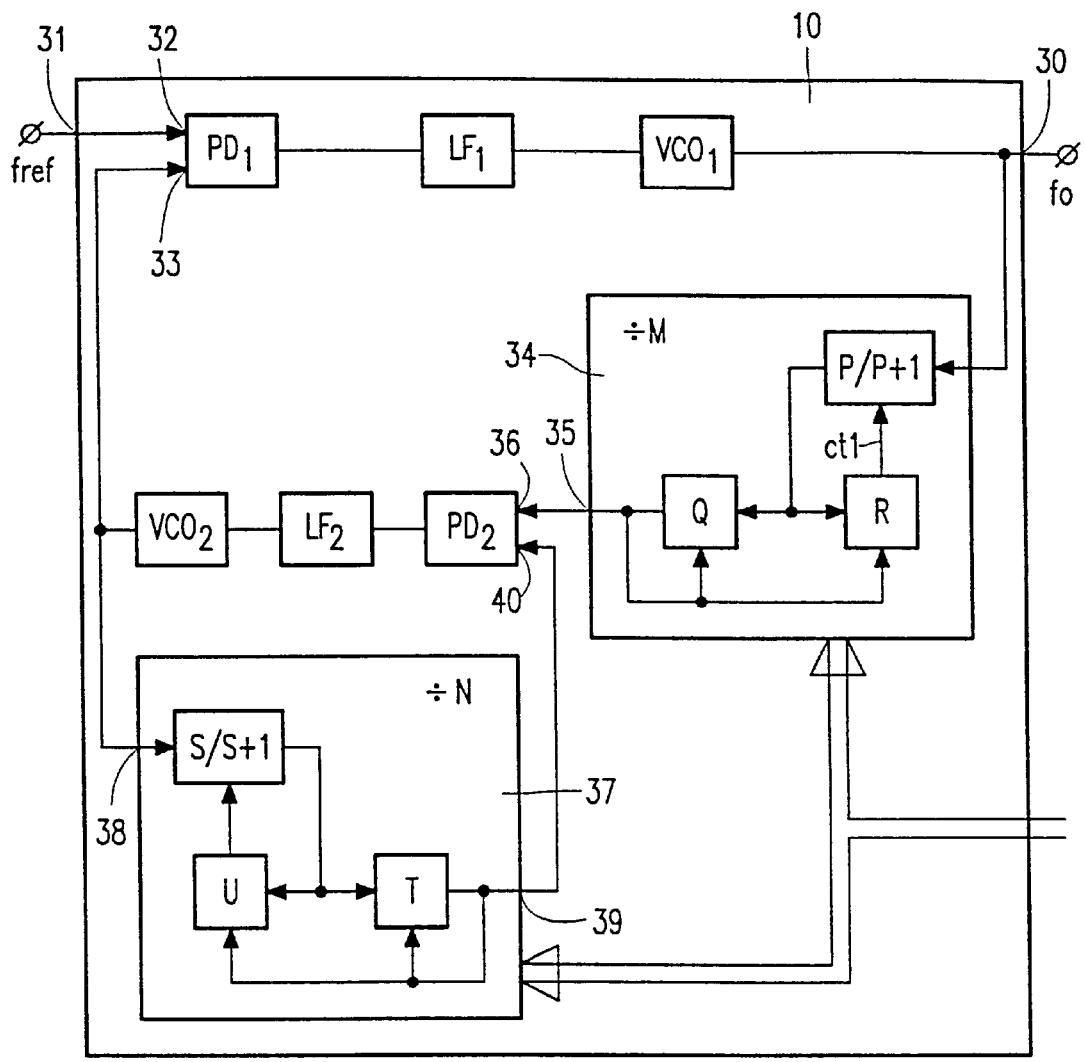

The present invention will now be described, by way of example, with reference to the accompanying drawings, wherein FIG. 1 schematically shows a radio communication system with multichannel radio devices according to the present invention, and FIG. 2 shows a block diagram of a fractional division frequency synthesizer according to the present invention.

Throughout the figures the same reference numerals are used for the same features.

FIG. 1 schematically shows a radio communication system 1 with multichannel radio devices 2 according to the present invention. Such a system can be a cellular radio system such as a GSM (FD/TDMA system), a CDMA system with frequency channels in conjunction to code division, a cordless telephone system like a DECT system, a paging system like a FLEX™ system, or any other suitable multichannel radio system. The system further comprises a radio base station 4 which can communicate with the radio device 2 and 3. Such a radio base station 4, can be a radio base station in a GSM network, for instance. The radio device 2 comprises an rf-receiver branch 5 and an rf-transmit branch 6 both coupled to an antenna 7 via a duplexer or transmit/receive switch 8. The receive branch comprises frequency down conversion means in the form of a mixer 9 and a frequency synthesizer 10, which can be a fractional division frequency synthesizer according to the present invention. The receive path 5 further comprises a low noise rf-amplifier 11 coupled to a receive filter 12. The synthesizer 10 provides a local oscillator frequency $f_{LO}$ to an input of the mixer 9. An output of the mixer 9 is fed to a further mixer stage or to a modulator (not shown in detail here). The transmit path 6 comprises a mixer 13 out which an input is coupled to an rf-power amplifier 14 which is coupled to the duplexer 8 via a transmit filter 15. A frequency synthesizer 16 provides a carrier frequency $f_c$ to the mixer 16. Data to be transmitted is supplied to an input of the mixer 13. The radio device 2 comprises a microcontroller 17 which is programmed to submit adjustment data to the synthesizers 10 and 16 so as to adjust their frequencies. Similarly, the radio device 3 comprises a mixer 20, a power amplifier 21, a transmit filter 22, a duplexer 23, an antenna 24, a low noise amplifier 25, a receive filter 26, a mixer 27 and a synthesizer 28.

FIG. 2 shows a block diagram of the fractional division frequency synthesizer 10 according to the present invention. The synthesizer 10 has an output 30 at which an output signal having an output frequency $f_0$ arises and an input 31 to which a reference signal is fed having a reference frequency $f_{ref}$. The reference $f_{ref}$ is generated by a reference generator (not shown in detail) such as a crystal or quartz oscillator. The output frequency $f_0$ is a fractional multiple of the reference frequency $f_{ref}$. The fractional division frequency synthesizer 10 comprises a forward path between the input 31 and the output 30 including a cascade of a first phase detector $PD_1$, a first loop filter $LF_1$, usually a low pass filter, and a first voltage controlled oscillator $VCO_1$. A first input 32 of the first phase detector $PD_1$ is coupled to the input 31. The synthesizer 10 further a feedback path between the output 30 and a second input 33 of the first phase detector $PD_1$ including a cascade of a first frequency divider 34 having an integer division ratio M, a second phase detector $PD_2$, a second loop filter$_2$, usually a low pass filter, and a second voltage controlled oscillator $VCO_2$. At output side, the oscillator $VCO_2$ is coupled to the second input 33 of the first phase detector $PD_1$. An output 35 of the first frequency divider 34 is coupled to a first input 36 of the second phase detector $PD_2$. The synthesizer 10 further comprises a second frequency divider 37 having an integer division ratio N, of which an input 38 is coupled to the second input 33 of the first phase detector $PD_1$ and of which an output 39 is coupled to a 10 second input 40 of the second phase detector $PD_2$. In an embodiment, the frequency dividers 34 and 37 are so-called dual-modulus prescalers, well-known in the art. In this embodiment, the divider 34 comprises counter P/P+1 whose division ratio can be switched from P to P+1 and vice versa by a control signal ct1, a programmable down counter Q, and a programmable down counter R. The programmable down counters Q and R are presentable. If a down counter has counted down from its preset value to zero, the output of the counter changes from one logic value to another logic value, e.g, from logic HIGH to logic LOW while at the same time the counter is loaded with its preset value. The microcontroller 17 can change the preset values so that any value for Q and R can be set. Such a prescaler has an overall division ratio of M=Q.P+R. Similarly, the frequency divider or prescaler 37 comprises a counter S/S+1, a programmable down counter T, and a programmable down counter U. The frequency divider 37 has an overall division ratio of N=T.S+U. For the principles of such a dual-modulus prescaler referred is to the handbook "Phase-Locked Loops", R. E. Best, McGraw-Hill, pp. 139 and 143–145, 1993, 2nd edition. On page 139, in FIG. 3.22 (d) a block diagram of such a dual-modulus prescaler is given. In the fractional division frequency divider according to the present invention, the frequency dividers can also be implemented as a 4-modulus prescaler, or any other suitable type of frequency divider. In the embodiment given, thus as an input/output relationship of the fractional division synthesizer 10 the following relationship holds: $f_0=(Q.P+R)/(T.S+U).f_{ref}$.

In view of the foregoing it will be evident to a person skilled in the art that various modifications may be made within the spirit and the scope of the present invention as hereinafter defined by the appended claims and that the present invention is thus not limited to the examples provided.

What is claimed is:

1. A multichannel radio device comprising at least an rf-receiver branch coupled to an antenna for receiving radio signals, the receiver branch comprising frequency down conversion means for down converting a received radio signal and a fractional division frequency synthesizer included in the frequency down conversion means, which synthesizer has an output signal at an output of the synthesizer, which is used for the down conversion of the received radio signal, the output signal having a frequency being a fractional multiple of a reference frequency generated by a reference frequency generator, which synthesizer comprises a forward path between the reference and said output including a cascade of a first phase detector, a first loop filter and a first voltage controlled oscillator, whereby a first input of the first phase detector is coupled to the reference, which synthesizer further comprises a feedback path between said output and a second input of the first phase detector including a cascade of a first frequency divider, a second phase detector, a second loop filter and a second voltage controlled oscillator, whereby an output of second voltage controlled oscillator is coupled to the second input of the first phase detector and an output of the first frequency divider is coupled to a first input of the second phase detector, and which synthesizer comprises a second frequency divider of which an input is coupled to the second input of the first phase detector and an output is coupled to a second input of the second phase detector, whereby division ratios of the first and second frequency dividers are integers.

2. A radio device as claimed in claim 1, wherein at least one of the frequency dividers is a prescaler.

3. A radio device as claimed in claim 1, wherein the division ratios are adjustable.

4. A radio device as claimed in claims 1, further comprising an rf-transmit branch coupled to the antenna.

5. A radio communication system comprising at least one multichannel radio device which comprises at least an rf-receiver branch coupled to an antenna for receiving radio signals, the receiver branch comprising frequency down conversion means for down converting a received radio signal and a fractional division frequency synthesizer included in the frequency down conversion means, which synthesizer has an output signal at an output of the synthesizer, which is used for the down conversion of the received radio signal, the output signal having a frequency being a fractional multiple of a reference frequency generated by a reference frequency generator, which synthesizer comprises a forward path between the reference and said output including a cascade of a first phase detector, a first loop filter and a first voltage controlled oscillator, whereby a first input of the first phase detector is coupled to the reference, which synthesizer further comprises a feedback path between said output and a second input of the first phase detector including a cascade of a first frequency divider, a second phase detector, a second loop filter and a second voltage controlled oscillator, whereby an output of second voltage controlled oscillator is coupled to the second input of the first phase detector and an output of the first frequency divider is coupled to a first input of the second phase detector, and which synthesizer comprises a second frequency divider of which an input is coupled to the second input of the first phase detector and an output is coupled to a second input of the second phase detector, whereby division ratios of the first and second frequency dividers are integers.

6. A fractional division frequency synthesizer, which synthesizer has an output signal at an output of the synthesizer having a frequency being a fractional multiple of a reference frequency generated by a reference frequency generator, which synthesizer comprises a forward path between the reference and said output including a cascade of a first phase detector, a first loop filter and a first voltage controlled oscillator, whereby a first input of the first phase detector is coupled to the reference, which synthesizer further comprises a feedback path between said output and a second input of the first phase detector including a cascade of a first frequency divider, a second phase detector, a second loop filter and a second voltage controlled oscillator, whereby an output of second voltage controlled oscillator is coupled to the second input of the first phase detector and an output of the first frequency divider is coupled to a first input of the second phase detector, and which synthesizer comprises a second frequency divider of which an input is coupled to the second input of the first phase detector and an output is coupled to a second input of the second phase detector, whereby division ratios of the first and second frequency dividers are integers.

* * * * *